United States Patent
Sim et al.

(10) Patent No.: US 9,087,302 B2
(45) Date of Patent: Jul. 21, 2015

(54) SYNAPSE FOR FUNCTION CELL OF SPIKE TIMING DEPENDENT PLASTICITY (STDP), FUNCTION CELL OF STDP, AND NEUROMORPHIC CIRCUIT USING FUNCTION CELL OF STDP

(75) Inventors: Jae Yoon Sim, Pohang-si (KR); Hyun Surk Ryu, Hwaseong-si (KR); Jun Haeng Lee, Hwaseong-si (KR)

(73) Assignees: Samsung Electronics Co., Ltd., Suwon-si (KR); Postech Academy-Industry Foundation, Pohang-si (KR)

( * ) Notice: Subject to any disclaimer, the term of this patent is extended or adjusted under 35 U.S.C. 154(b) by 433 days.

(21) Appl. No.: 13/490,699

(22) Filed: Jun. 7, 2012

(65) Prior Publication Data
US 2012/0317063 A1 Dec. 13, 2012

(30) Foreign Application Priority Data
Jun. 8, 2011 (KR) ........................ 10-2011-0054972

(51) Int. Cl.
G06N 3/063 (2006.01)
G06N 3/04 (2006.01)

(52) U.S. Cl.
CPC ............... *G06N 3/063* (2013.01); *G06N 3/049* (2013.01)

(58) Field of Classification Search
None
See application file for complete search history.

(56) References Cited

U.S. PATENT DOCUMENTS

| 7,599,895 | B2 | 10/2009 | Nugent | |
|---|---|---|---|---|
| 8,694,452 | B2* | 4/2014 | Aparin et al. | 706/38 |
| 2005/0122768 | A1* | 6/2005 | Fukumoto | 365/158 |
| 2005/0174854 | A1* | 8/2005 | Tsushima et al. | 365/185.29 |
| 2008/0049487 | A1* | 2/2008 | Yoshimura et al. | 365/148 |
| 2008/0162391 | A1 | 7/2008 | Izhikevich | |
| 2009/0105786 | A1 | 4/2009 | Fetz et al. | |
| 2009/0292661 | A1 | 11/2009 | Haas | |
| 2010/0076916 | A1 | 3/2010 | Van der Made | |
| 2010/0220523 | A1 | 9/2010 | Modha et al. | |
| 2010/0299296 | A1 | 11/2010 | Modha et al. | |
| 2010/0299297 | A1* | 11/2010 | Breitwisch et al. | 706/33 |
| 2012/0014169 | A1* | 1/2012 | Snider | 365/148 |
| 2013/0314969 | A1* | 11/2013 | Kouno | 365/65 |

FOREIGN PATENT DOCUMENTS

| KR | 10-2010-0099256 | 9/2010 |
|---|---|---|
| KR | 10-2010-0129741 | 12/2010 |

OTHER PUBLICATIONS

Borghetti, Julien et al.; "A hybrid nonmemristor/transistor logic circuit capable of self-programming"; 2009; PNAS, vol. 106, No. 6; pp. 1699-1703.*
Jo, Sung Hyun et al.; "Nanoscale Memristor Device as Synapse in Neuromorphic Systems"; 2010; American Chemical Society; Nano Lett. 2010, 10; pp. 1297-1301.*
Linares-Barranco, Bernabe, et al., "Memristance can explain Spike-Time-Dependent-Plasticity in Neural Synapses," *Nature Precedings*, Mar. 31, 2009, pp. 1-4.

(Continued)

*Primary Examiner* — Stanley K Hill
(74) *Attorney, Agent, or Firm* — NSIP Law

(57) ABSTRACT

A synapse for a spike timing dependent (STDP) function cell includes a memory device having a variable resistance, such as a memristor, and a transistor connected to the memory device. A channel of the memory device is connected in series with a channel of the transistor.

31 Claims, 14 Drawing Sheets

(56) References Cited

OTHER PUBLICATIONS

Biolek, Zdenek, et al., "SPICE Model of Memristor with Nonlinear Dopant Drift," *Radioengineering 2009*, vol. 18, No. 2, Jun. 2009, pp. 210-214.

Snider, Greg S., "Spike-Timing Dependent Learning in Memristive Nanodevices," *2008 IEEE/ACM International Symposium on Nanoscale Architectures*, 2008, pp. 85-92.

International Search Report issued Nov. 16, 2012 in counterpart International Application No. PCT/KR2012/003107 (3 pages, in English).

Kuzum, Duygu et al. "Nanoelectronic Programmable Synapses Based on Phase Change Materials for Brain-Inspired Computing," Nano Letters 2012 12(5) pp. 2179-2186, Jun. 14, 2011 (8 pagesm in English).

Abbott, et al., "Synaptic Plasticity: Taming the Beast," Nature Neuroscience vol. 3, pp. 1178-1183, Nov. 2000 (6 pages, in English).

\* cited by examiner

SYNAPSE FOR FUNCTION CELL OF SPIKE TIMING DEPENDENT PLASTICITY (STDP), FUNCTION CELL OF STDP, AND NEUROMORPHIC CIRCUIT USING FUNCTION CELL OF STDP

CROSS-REFERENCE TO RELATED APPLICATIONS

This application claims the benefit under 35 USC 119(a) of Korean Patent Application No. 10-2011-0054972 filed on Jun. 8, 2011, in the Korean Intellectual Property Office, the entire disclosure of which is incorporated herein by reference.

BACKGROUND

1. Field

The following description relates to a synapse for a spike timing dependent plasticity (STDP) function cell, a STDP function cell using the synapse, and an STDP device using the STDP function cell.

2. Description of Related Art

In a brain, tens of billions of nerve cells, that is, neurons, are interconnected through a complex nerve network. Each neuron achieves intellectual abilities such as learning and memory through synapses that exchange signals with thousands of other neurons. The term neuron refers to a structural and functional unit of a nervous system, and also to a basic unit of data transmission. A synapse refers to a connection point between neurons, more specifically, a connection point between an axon of one neuron and a dendrite of another neuron. That is, one neuron is connected to thousands of other neurons through the synapses.

By manufacturing an artificial nervous system copying a biological nervous system in units of a neuron, a data processing system of a brain or a new scheme for data processing and storage of a memory device may be achieved. In manufacturing of such a system, conventional semiconductor manufacturing technology is limited in the ability to integrate a large number of artificial neurons in a small area. Thus, to overcome the limit, a nano device exhibiting characteristics similar to a nerve phenomenon may be used for manufacturing an artificial neuron.

In an electronic neuron cell, circuit, or device, a signal transmitted from one neuron cell to another neuron cell may leak to another connected neuron cell, thereby unintentionally affecting the other neuron cell. Accordingly, there is a desire for a new scheme of implementing an electronic neuron cell, circuit, or device capable of preventing signal leakage to other neuron cells, and a method for controlling an artificial electronic neuron manufactured using the electronic neuron device.

SUMMARY

According to a general aspect, a synapse for a spike timing dependent plasticity (STDP) function cell includes a memory device having a variable resistance; and a transistor connected to the memory device; wherein a channel of the memory device is connected in series with a channel of the transistor.

The resistance of the memory device may vary according to a synaptic weight dependent on a voltage difference between voltages applied to both ends of the memory device.

The memory device may be connected to a drain terminal of the transistor.

The synapse may be configured to that a same voltage is applied to the memory device and a source terminal of the transistor.

The synapse may further include a first terminal connected to the memory device; and a second terminal connected to a source terminal of the transistor. The synapse may be connected to a pre-synaptic neuron through the first terminal, and connected to a post-synaptic neuron through the second terminal.

The synapse may be configured to selectively operate in a communication mode in which the synapse transmits information from the pre-synaptic neuron to the post-synaptic neuron, and a learning mode in which a synaptic weight of the synapse changes in response to a voltage difference between voltages applied to both ends of the memory device. The synapse may be configured to switch between the communication mode and the learning mode according to a time division multiplexing (TDM) scheme.

In the communication mode, the synapse may transmit the information from the pre-synaptic neuron to the post-synaptic neuron by transmitting a signal generated by a spike fired by the pre-synaptic neuron to the post-synaptic neuron. In the learning mode, the synaptic weight of the synapse may change as a result of the resistance of the memory device changing in response to the voltage difference between the voltages applied to both ends of the memory device.

The synapse may be configured to switch to the communication mode by switching the first terminal to connect to a drain voltage (VDD) of the pre-synaptic neuron, and switching the second terminal to connect to a membrane capacitor of the post-synaptic neuron.

The synapse may be configured to switch to the learning mode by switching the first terminal to connect to an output of a pulse shaper of the pre-synaptic neuron, and switching the second terminal to connect to an output of a pulse shaper of the post-synaptic neuron.

According to a general aspect, a spike timing dependent (STDP) function cell having an STDP function for a neuromorphic circuit includes a synapse including a memory device having a variable resistance, a transistor connected to the memory device, a first terminal, and a second terminal; a pre-synaptic neuron connected to the memory device through the first terminal of the synapse; and a post-synaptic neuron connected to a source terminal of the transistor through the second terminal of the synapse; wherein a channel of the memory device is connected in series with a channel of the transistor.

The resistance of the memory device may vary according to a synaptic weight dependent on a voltage difference between voltages applied to both ends of the memory device.

The pre-synaptic neuron and the post-synaptic neuron may each include an electronic neuron circuit configured to fire a spike; a spike time recorder configured to record a point in time when the electronic neuron circuit fires the spike as a digital code; and a pulse shaper configured to restore a pulse shape of the spike based on the digital code; wherein the spike time recorder and the pulse shaper are configured to operate in synchronization with a clock.

The pulse shaper may include a discrete time finite impulse response (FIR) filter configured to sequentially shift the digital code and sum the shifted digital code to restore the pulse shape of the spike.

The STDP function cell may be configured to selectively operate in a communication mode in which the synapse transmits information from the pre-synaptic neuron to the post-synaptic neuron, and a learning mode in which a synaptic weight of the synapse changes in response to a voltage difference between voltages applied to both ends of the memory device. The STDP function cell may be configured to switch between the communication mode and the learning mode according to a time division multiplexing (TDM) scheme.

The STDP function cell may be configured to switch to the communication mode by switching the first terminal to connect to a drain voltage (VDD) of the pre-synaptic neuron, and switching the second terminal to connect to a membrane capacitor of the post-synaptic neuron.

The STDP function cell may be configured to switch to the learning mode by switching the first terminal to connect to an output of the pulse shaper of the pre-synaptic neuron, and switching the second terminal to connect to an output of the pulse shaper of the post-synaptic neuron.

An impedance of the synapse when the STDP function cell is not operating in the communication mode and is not operating in the learning mode may be higher than an impedance of the synapse when the STDP function cell is operating in the communication mode and is operating in the learning mode.

According to a general aspect, a neuromorphic circuit including a plurality of spike timing dependent (STDP) function cells includes a plurality of synapses arranged in a crossbar structure, each of the synapses including a memory device having a variable resistance, and a transistor connected to the memory device; a plurality of pre-synaptic neurons each connected to a respective column of the crossbar structure; and a plurality of post-synaptic neurons each connected to a respective row of the crossbar structure. Ones of the synapses arranged in a same row of the crossbar structure are all connected to the post-synaptic neuron connected to that row, and are connected to the pre-synaptic neuron connected to a respective column of the crossbar structure. Ones of the synapses arranged in a same column of the crossbar structure are all connected to the pre-synaptic neuron connected to that column, and are each connected to the post-synaptic neuron connected to a respective row of the crossbar structure. Each of the STDP function cells includes one of the synapses, one of the pre-synaptic neurons, and one of the post-synaptic neurons. In each of the synapses, a channel of the memory device is connected in series with the transistor.

The resistance of the memory device may be vary according to a synaptic weight dependent on a voltage difference between voltages applied to both ends of the memory device.

Each of the STDP function cells may be configured to selectively operate in a communication mode in which the synapse transmits information from the pre-synaptic neuron to the post-synaptic neuron, and a learning mode in which a synaptic weight of the synapse changes in response a voltage difference between voltages applied to both ends of the memory device. Each of the STDP function cells may be configured to switch between the communication mode and the learning according to a time division multiplexing (TDM) scheme.

According to a general aspect, a synapse for a spike timing dependent plasticity (STDP) function cell includes a first synapse terminal; a second synapse terminal; a synapse control terminal; a memory device having a variable resistance and including a first terminal and a second terminal; and a transistor including a first terminal, a second terminal, and a control terminal that controls a flow of current between the first terminal of the transistor and the second terminal of the transistor; wherein the first terminal of the memory device is connected to the first synapse terminal; the second terminal of the memory device is connected to the first terminal of the transistor; the second terminal of the transistor is connected to the second synapse terminal; and the control terminal of the transistor is connected to the synapse control terminal.

The resistance of the memory device may determine a synaptic weight of the synapse, and may depend on a voltage difference between a first voltage that was last applied to the first terminal of the memory device during a last learning mode of the synapse and a second voltage that was last applied to the second terminal of the memory device during the last learning mode of the synapse.

The resistance of the memory device may determine a synaptic weight of the synapse, and may depend on a timing between a first neuron spike that was last applied to the first terminal of the memory device during a last learning mode of the synapse and a second neuron spike that was last applied to the second terminal of the memory device during the last learning mode of the synapse.

The resistance of the memory device may determine a synaptic weight of the synapse, and may change in accordance with an STDP function in response to a voltage difference between a voltage of a first neuron spike applied to the first terminal of the memory device during a learning mode of the memory device and a voltage of a second neuron spike applied to the second terminal of the memory device during the learning mode of the memory device.

The voltage difference may depend on a difference between a time at which the first neuron spike is fired and a time at which the second neuron spike is fired.

The first neuron spike may be a pre-synaptic neuron spike; the second neuron spike may be a post-synaptic neuron spike; the resistance of the memory device may decrease if the post-synaptic neuron spike is fired after the pre-synaptic neuron spike is fired, thereby increasing the synaptic weight of the synapse; and the resistance of the memory device may increase if the post-synaptic neuron spike is fired before the pre-synaptic neuron spike is fired, thereby decreasing the synaptic weight of the synapse.

The transistor may further include a channel connected between the first terminal of the transistor and the second terminal of the transistor; and the control terminal of the transistor may be a gate terminal of the transistor.

The first terminal of the transistor may be a drain terminal of the transistor; and the second terminal of the transistor may be a source terminal of the transistor.

A current may not be able to flow between the first terminal of the synapse and the second terminal of the synapse when the control terminal of the transistor turns the transistor off so that current cannot flow between the first terminal of the transistor and the second terminal of the transistor.

According to a general aspect, a spike timing dependent plasticity (STDP) function cell includes a synapse including a first synapse terminal, a second synapse terminal, and a synapse control terminal; a pre-synaptic neuron connected to the first synapse terminal; and a post-synaptic neuron connected to the second synapse terminal; wherein the synapse further includes a memory device having a variable resistance and including a first terminal and a second terminal; and a transistor including a first terminal, a second terminal, and a control terminal that controls a flow of current between the first terminal of the transistor and the second terminal of the transistor; the first terminal of the memory device is connected to the first synapse terminal; the second terminal of the memory device is connected to the first terminal of the transistor; the second terminal of the transistor is connected to the second synapse terminal; and the control terminal of the transistor is connected to the synapse control terminal.

The pre-synaptic neuron and the post-synaptic neuron may each include an electronic neuron circuit configured to fire a neuron spike; a spike time recorder configured to receive the neuron spike from the electronic neuron circuit and record a firing time point of the neuron spike as a digital code; and a pulse shaper configured to receive the digital code from the spike time recorder and output a voltage pulse having a shape of the neuron spike in response to the digital code; the pre-synaptic neuron may further include a first voltage supply terminal; and a second voltage supply terminal; the post-synaptic neuron may further include a capacitor; in a communication mode of the STDP function cell, the first synapse terminal may be connected to the first voltage supply terminal of the pre-synaptic neuron, the second synapse terminal may be connected to the capacitor of the post-synaptic neuron, and the synapse control terminal may receive the neuron spike fired by the electronic neuron circuit of the pre-synaptic neuron; and in a learning mode of the STDP function cell, the first synapse terminal may receive the voltage pulse output by the pulse shaper of the pre-synaptic neuron, the second synapse terminal may receive the voltage pulse output by the pulse shaper of the post-synaptic neuron, and the synapse control terminal may be connected to the second voltage supply terminal of the pre-synaptic neuron.

Other features and aspects will be apparent to one of ordinary skill in the art from the following detailed description, the drawings, and the claims.

DETAILED DESCRIPTION

Figure 1:
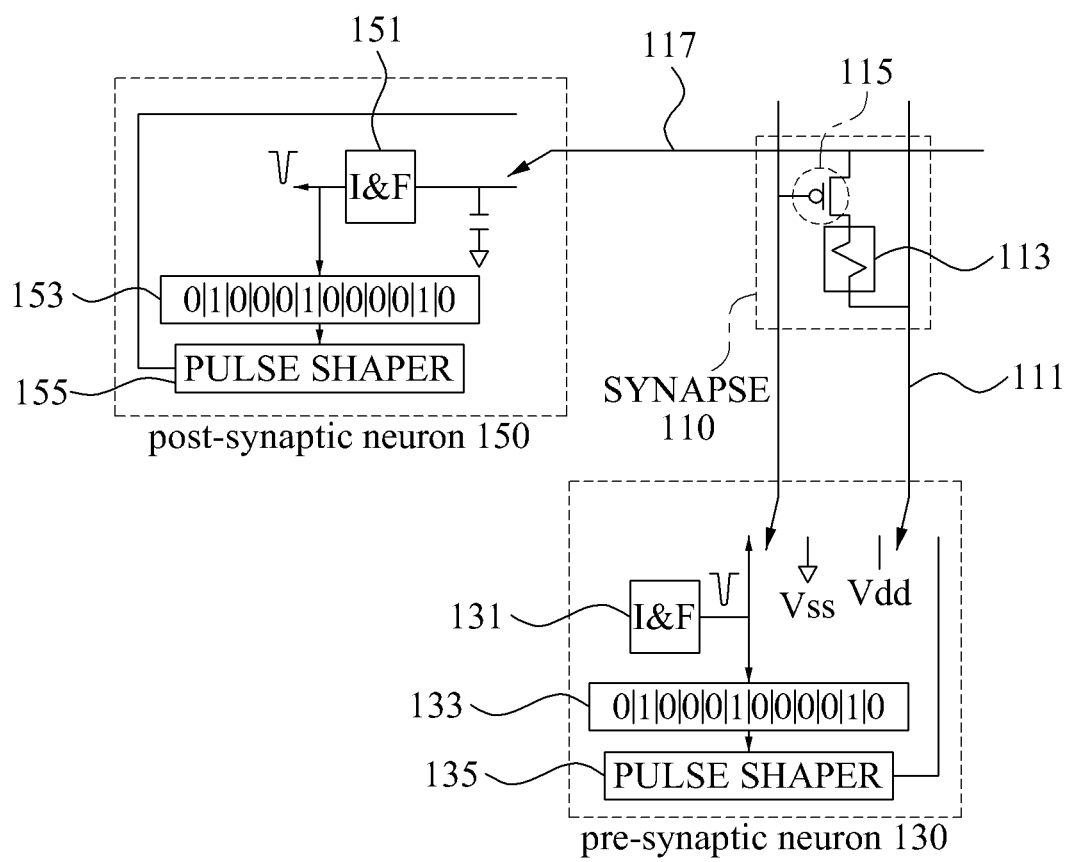
FIG. 1 is a diagram illustrating a structure of a spike timing dependent plasticity (STDP) function cell including a synapse according to an example of an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to those of ordinary skill in the art. Any specific sequences of processing steps and/or operations described are merely examples, and the sequences of processing steps and/or operations are not limited to those set forth herein, and may be changed as is known in the art, with the exception of processing steps and/or operations necessarily occurring in a certain order. Also, description of well-known functions and constructions may be omitted for increased clarity and conciseness.

Throughout the drawings and the detailed description, the same reference numerals refer to the same elements, features, and structures. The relative size and depiction of these elements, features, and structures may be exaggerated for clarity, illustration, and convenience.

FIG. 1 is a diagram illustrating a structure of a spike timing dependent plasticity (STDP) function cell 100 including a synapse according to an example of an embodiment.

Referring to FIG. 1, the STDP function cell 100 according to an example of an embodiment includes a pre-synaptic neuron 130, a post-synaptic neuron 150, and a synapse 110 interconnecting the pre-synaptic neuron 130 and the post-synaptic neuron 150.

STDP refers to a biological process that controls a connection strength among neurons in a brain. More specifically, STDP controls the connection strength based on relative timing of an output and input action potential or spike of a particular neuron. Hereinafter, action potential and spike are to be understood as having the same meaning. STDP is well known to one of ordinary skill in the art, and thus will not be further described herein.

The synapse 110 includes a memory device 113 having a variable resistance, and a transistor 115 connected to the memory device 113. For example, as shown in FIG. 1, the transistor 115 may be a positive metal oxide semiconductor (PMOS) transistor. A channel of the memory device 113 is connected to a drain terminal of the transistor 115 so that the channel of the memory device 114 is connected in series with a channel of the transistor 115.

A resistance of the memory device 113 varies according to a synaptic weight dependent on a voltage difference between voltages applied to both ends of the memory device 113. A same voltage may be applied to the memory device 113 and a source terminal of the transistor 115.

The memory device 113 may be a memristor, a phase change memory (PCM), or another device operating in a similar manner.

The synapse 110 includes a first terminal 111 connected to the memory device 113, and a second terminal 117 connected to the source terminal of the transistor 115. The synapse 110 is connected to the pre-synaptic neuron 130 through the first terminal 111, and is connected to the post-synaptic neuron 150 through the second terminal 117.

The synapse 110 is configured to selectively operate in a communication mode in which the synapse 110 transmits information from the pre-synaptic neuron 130 to the post-synaptic neuron 150, and a learning mode in which a synaptic weight of the synapse 110 changes in response to a voltage difference between voltages applies to both ends of the memory device 113. The synapse 110 switches between different connections with the pre-synaptic neuron 130 and the post-synaptic neuron 150 to switch between the communication mode and the learning mode.

In the communication mode, the synapse 110 transmits the information from the pre-synaptic neuron 130 to the post-synaptic neuron 150 by transmitting a signal generated by a spike fired by the pre-synaptic neuron 130 to the post-synaptic neuron 150. Operations of the synapse 110 and the STDP function cell 100 in the communication mode will be described with reference to FIG. 2.

In the learning mode, the synaptic weight of the synapse 110 changes as a result of the resistance of the memory device 113 changing in response to the voltage difference between the voltages applied to both ends of the memory device 113. The amount by which the resistance of the memory device 113 changes depends on a time difference between a firing time point of the spike fired by the post-synaptic neuron 150 in the learning mode of the synapse 110, and a firing time point of the spike fired by the pre-synaptic neuron 130 during the learning mode of the synapse 110. Operations of the synapse 110 and the STDP function cell 100 in the learning mode will be described with reference to FIG. 3.

The STDP function cell 100 is configured to switch between the communication mode and the learning mode according to a time division multiplexing (TDM) scheme. The TDM scheme will be described with reference to FIG. 4.

As described above, the STDP function cell 100 includes the pre-synaptic neuron 130 and the post-synaptic neuron 150. The pre-synaptic neuron 130 and the post-synaptic neuron 150 respectively include electronic neuron circuits 131 and 151, spike time recorders 133 and 153, and pulse shapers 135 and 155.

The electronic neuron circuits 131 and 151 fire a spike. For example, the electronic neuron circuits 131 and 151 may be an integrate and fire (I&F) spiking neuron as shown in FIG. 1, or a soma, or any other electronic neuron circuit operating in a similar manner. The spike time recorders 133 and 153 record a spike firing time point of the electronic neuron circuits 131 and 151 in the form of a digital code. The pulse shapers 135 and 155 restore a pulse shape of the spike based on the digital code.

The pulse shapers 135 and 155 may include a discrete time finite impulse response (FIR) filter that sequentially shifts the digital codes output from the spike time recorders 133 and 153 and sums the digital codes to restore the pulse shape of the spike. The discrete time FIR filter will be described in further detail with reference to FIG. 6.

The spike time recorders 133 and 153 and the pulse shapers 135 and 155 may operate in synchronization with a clock.

According to an example of an embodiment, the resistance of the memory device changes in response to a voltage difference obtained by subtracting the pulse shape of the spike fired by the electronic neuron circuit 131 of the pre-synaptic neuron 131 from the pulse shape of the spike fired by the electronic neuron circuit 151 of the post-synaptic neuron 150. The spike time recorders 133 and 153 and the pulse shapers 135 and 155 may be synchronized digital circuits used for restoring the pulse shape of the spike. Since digital circuits are used in restoring the pulse shape of the spike, influences caused by changes in pressure, volume, and temperature (PVT) may be reduced.

The STDP function cell 100 solves a signal leakage problem by increasing an impedance of the synapse 110 when the STDP function cell 100 is not operating in the communication mode and is not operating in the learning mode. That is, when the STDP function cell 100 is not operating in the communication mode and is not operating in the learning mode, the STDP function cell 100 turns the transistor 115 off so that the impedance of the synapse 110 is higher than an impedance of the synapse 110 when the STDP function cell 100 is operating in the communication mode and is operating in the learning mode.

When the spikes fired by the electronic neuron circuits 131 and 151 are modeled as an electrical waveform, a change of the synaptic weight of the synapse 110 may be expressed as a difference between the electrical waveform of a spike fired by the pre-synaptic neuron 130 (hereinafter, referred to as a 'pre-synaptic spike') and the electrical waveform of a spike fired by the post-synaptic neuron 150 (hereinafter, referred to as a 'post-synaptic spike'). This may be expressed by Equation 1 and Equation 2 as follows.

$$\Delta w = \xi(t_{pos} - t_{pre}) \quad (1)$$

Here, $\xi$ denotes the STDP function, $t_{pre}$ denotes the pre-synaptic spike, $t_{pos}$ denotes the post-synaptic spike, and $\Delta w$ denotes the change in the synaptic weight. The STDP function is well known to one of ordinary skill in the art, and thus will not be further described herein.

$$\Delta w = P(t_{pos}) - P(t_{pre}) \quad (2)$$

Here, $P(t_{pre})$ denotes the electrical waveform of the pre-synaptic spike, $P(t_{pos})$ denotes the electrical waveform of the post-synaptic spike, and $\Delta w$ denotes the change in the synaptic weight.

Equation 1 and Equation 2 may be combined as Equation 3 as follows.

$$\Delta w = \xi(t_{pos} - t_{pre}) = P(t_{pos}) - P(t_{pre}) \quad (3)$$

The synaptic weight change $\Delta w$ produced by N pre-synaptic spikes and N post-synaptic spikes may be expressed by Equation 4 as follows.

$$\Delta w = \sum_{i=1}^{N} \sum_{j=1}^{N} \xi(t_i - t_j) \quad (4)$$

Here, $t_i$ denotes a spike firing time point of the post-synaptic neuron, and $t_j$ denotes a spike firing time point of the pre-synaptic neuron.

It may be derived from Equation 4 that the synaptic weight change $\Delta w$ produced by N pre-synaptic spikes and the N post-synaptic spikes is proportional to a difference between a summation of the waveforms of the N pre-synaptic spikes and a summation of the waveforms of the N post-synaptic spikes as shown by Equation 5 as follows.

$$\Delta w = \sum_{i=1}^{N} \sum_{j=1}^{N} \xi(t_i - t_j) \quad (5)$$

$$= \sum_{i=1}^{N} \sum_{j=1}^{N} (P(t_i) - P(t_j))$$

$$= \sum_{i=1}^{N} \left[ N \cdot P(t_i) - \sum_{j=1}^{N} P(t_j) \right]$$

$$= N\sum_{i=1}^{N} P(t_i) - N\sum_{j=1}^{N} P(t_j) \propto \left(\sum_{i=1}^{N} P(t_i) - \sum_{j=1}^{N} P(t_j)\right)$$

According to an example of an embodiment, STDP learning may be achieved based on a method for changing the synaptic weight in accordance with Equation 5.

The spike time recorders 133 and 153 and the pulse shapers 135 and 155 of the pre-synaptic neuron 130 and the post-synaptic neuron 150 produce summations of the waveforms of the N pre-synaptic spikes and the N post-synaptic spikes that are expressed by $$\sum_{j=1}^{N} (P(t_j)) \text{ and } \sum_{i=1}^{N} (P(t_i))$$

in Equation 5.

When output voltages of the pulse shapers 135 and 155 are applied to both ends of the memory device 113 in the learning mode, a difference between the voltages applied to both ends of the memory device 113 is calculated by $$\sum_{i=1}^{N} P(t_i) - \sum_{j=1}^{N} P(t_j),$$

which is proportional to the synaptic weight change Δw.

A magnitude and a direction of electric charges flowing in the memory device 113 are determined by a polarity and a magnitude of the voltage difference between the voltages applied to both ends of the memory device 113, which is proportional to Δw. The flow of these electric charges changes the resistance of the memory device 113 in accordance with the STDP function ξ. Thus, the STDP function cell 100 performs the STDP function as a result of the resistance of the memory device 113 being changed according to the polarity and the magnitude of the voltage difference between the voltages applied to both ends of the memory device 113, which is proportional to Δw.

Figure 2:
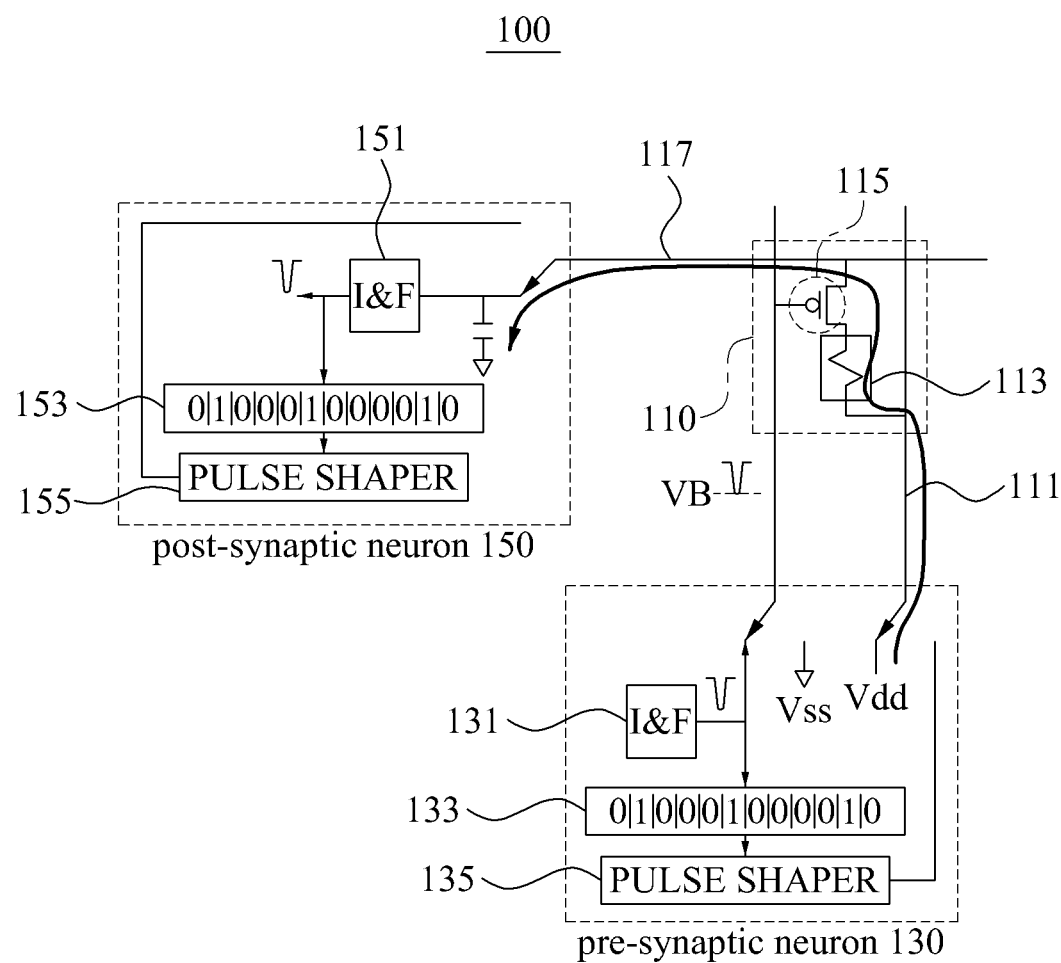
FIG. 2 is a diagram illustrating an operation of the STDP function cell shown in FIG. in a communication mode.

FIG. 2 is a diagram illustrating an operation of the STDP function cell 100 shown in FIG. 1 in the communication mode.

The operation in the communication mode is performed through a path denoted by an arrow in FIG. 2. In the communication mode, the synapse 110 switches the first terminal 111 to connect to a drain voltage (VDD) of the pre-synaptic neuron 130, and switches the second terminal 117 to connect to a membrane capacitor of the post-synaptic neuron 150. An output of the electronic neuron circuit 131 of the pre-synaptic neuron 130 drives the transistor 115, for example, the PMOS transistor shown in FIG. 2, of the synapse 110.

Accordingly, when the pre-synaptic spike is fired by the pre-synaptic neuron 130, the transistor 115 is turned on, and therefore a signal from the pre-synaptic neuron 130 is transmitted to the post-synaptic neuron 150.

When the transistor 115 is turned off, an impedance of the synapse 110 is extremely high. Therefore, a signal from the pre-synaptic neuron 130 that is being transmitted through a different synapse (not shown) to a different post-synaptic neuron (not shown) can be prevented from leaking through the synapse 110 to the post-synaptic neuron 150. Also, a signal from a different pre-synaptic neuron (not shown) connected to the synapse 110 that is being transmitted to a different post-synaptic neuron (not shown) can be prevented from leaking through the synapse 110 to the post-synaptic neuron 150. Accordingly, the structure of the synapse 110 solves a signal leakage problem.

In the communication mode, the synapse 110 transmits the signal generated by the spike fired by the pre-synaptic neuron 130 to the post-synaptic neuron 150, thereby transmitting information from the pre-synaptic neuron 130 to the post-synaptic neuron 150.

Figure 3:
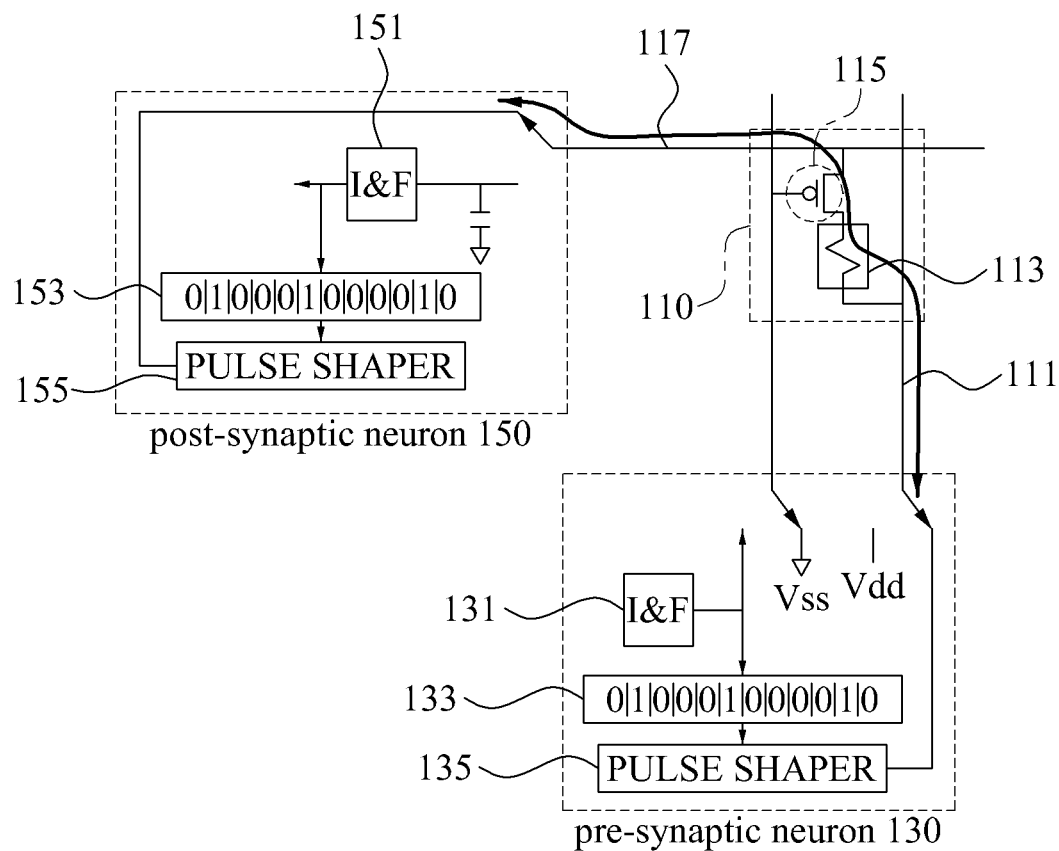
FIG. 3 is a diagram illustrating an operation of the STDP function cell shown in FIG. in a learning mode.

FIG. 3 is a diagram illustrating an operation of the STDP function cell 100 shown in FIG. 1 in the learning mode.

In the learning mode, the synaptic weight of the synapse 110 changes as a result of the resistance of the memory device 113 changing in response to a voltage difference between voltages applied to both ends of the memory device 113.

The amount by which the resistance of the memory device 113 changes depends on a time difference between a spike firing time point of the spike fired by the post-synaptic neuron 150 and a spike firing time point of the spike fired by the pre-synaptic neuron 130 during the learning mode of the synapse 110.

The operation of the learning mode is performed through a path denoted by a double-headed arrow in FIG. 3.

In the learning mode, a gate of the transistor 115, for example the PMOS transistor shown in FIG. 3, of the synapse 110 is switched to connect to a source voltage (VSS) of the pre-synaptic neuron 130. Accordingly, the transistor 115 is turned on. Also, the synapse 110 switches the first terminal 111 to connect to an output of the pulse shaper 135 of the pre-synaptic neuron 130, and switches the second terminal 117 to connect to an output of the pulse shaper 155 of the post-synaptic neuron 150.

A voltage difference between output voltages of the pulse shapers 135 and 155 applied to both ends of the memory device 113 generates a charge flow in the memory device 1113, and the charge flow changes the resistance of the memory device 113 as discussed above.

Figure 4:
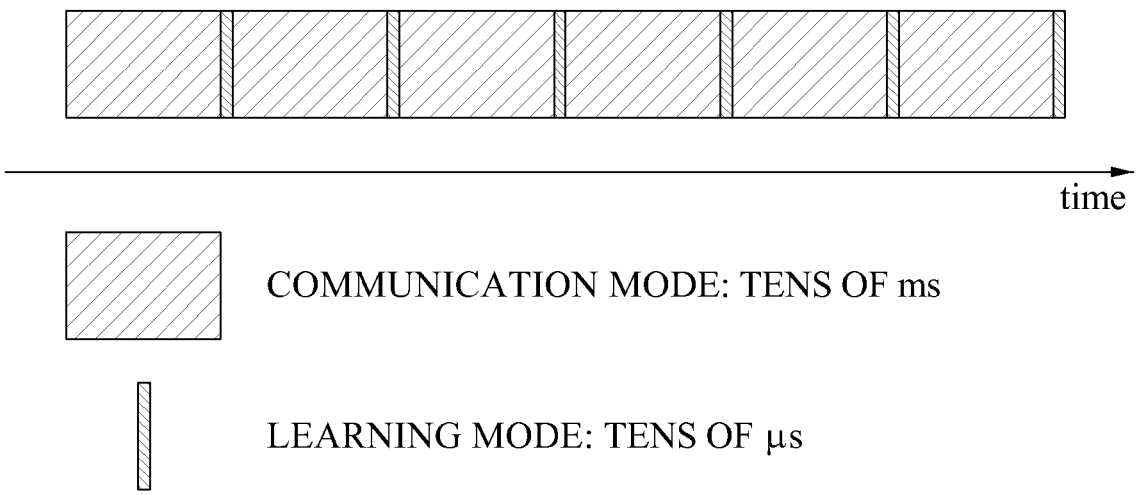
FIG. 4 is a timing diagram illustrating a time division multiplexing (TDM) scheme of a communication mode and a learning mode according to an example of an embodiment.

FIG. 4 is a timing diagram illustrating a time division multiplexing (TDM) scheme of a communication mode and a learning mode according to an example of an embodiment.

A synapse and an STDP function cell according to an example of an embodiment switch between the communication mode and the learning mode according to the TDM scheme.

The communication mode is performed for a duration of tens of milliseconds (ms), and the learning mode is performed for a duration of tens of microseconds (μs). Thus, the communication mode is a dominant mode of operation. Information is transmitted from a pre-synaptic neuron to a post-synaptic neuron in the communication mode. A resistance of a memory device of a synapse is changed in the learning mode.

Figure 5:
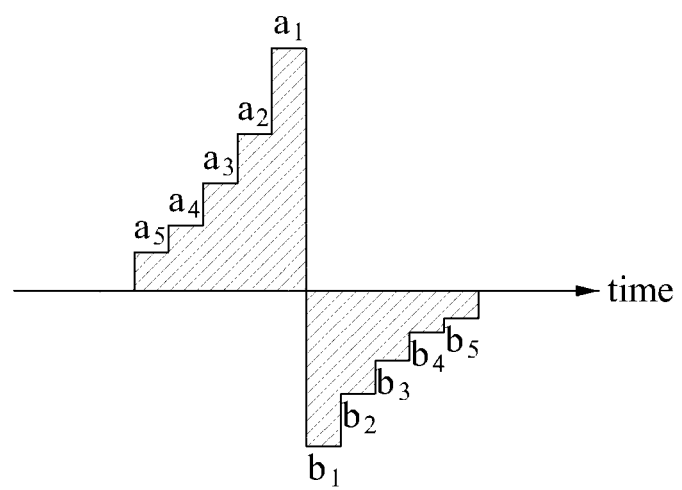
FIG. 5 is a diagram illustrating an impulse response of a pulse shaper according to an example of an embodiment.
Figure 6:
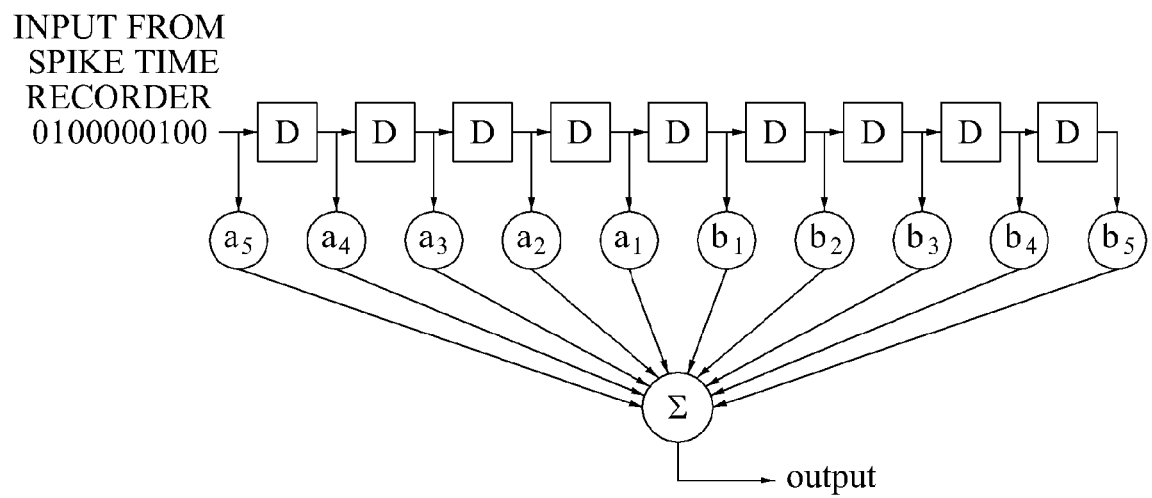
FIG. 6 is a diagram illustrating a discrete time finite impulse response (FIR) filter according to an example of an embodiment.

FIG. 5 is a diagram illustrating an impulse response of a pulse shaper according to an example of an embodiment. FIG. 6 is a diagram illustrating a discrete time finite impulse response (FIR) filter according to an example of an embodiment.

As described with reference to FIG. 1, spike time recorders record and store, in the form of a digital code, spike firing time points of electronic neuron circuits of a pre-synaptic neuron and a post-synaptic neuron.

For example, in synchronization with a clock, the spike time recorder records a first logic value, for example '1', in the digital code when the electronic neuron circuit fires a spike, and records a second logic value, for example '0', in the digital code when the electronic neuron circuit does not fire a spike.

The pulse shaper restores a pulse shape of the spike based on the digital code. A synaptic weight of a synapse determined by a memory device of the synapse may be changed using the restored pulse shape. The synaptic weight changes in response to a voltage difference between voltages produced by restored pulse shapes applied to both ends of the memory device.

The impulse response of the pulse shaper is designed to be similar to an action potential, that is, a spike, of a real neuron. A waveform shown in FIG. 5 is output from the pulse shaper when a single logic value '1' is input to the pulse shaper.

The pulse shaper may include a discrete time FIR filter that sequentially shifts the digital code output from the pulse shaper and sums the shifted digital code to restore the pulse shape of the spike. The structure of the discrete time FIR filter will be described with reference to FIG. 6.

The digital code, for example '0100000100' as shown in FIG. 6, stored in the spike time recorder may be represented by a summation of pulse shapes shifted in time produced by the discrete time FIR filter of FIG. 6.

Figure 7:
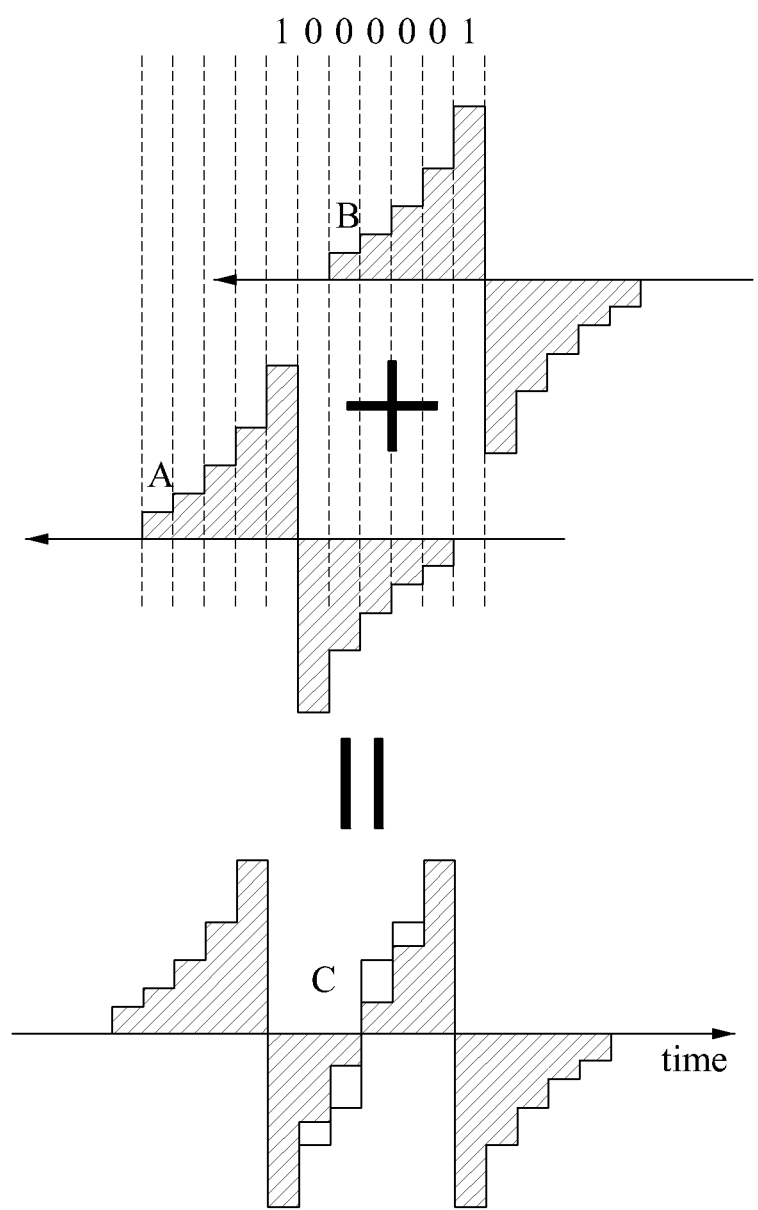
FIG. 7 is a diagram illustrating a pulse shape output from the discrete time FIR filter of FIG. 6 when the digital code '100000100' is input from a spike time recorder according to an example of an embodiment.

FIG. 7 is a diagram illustrating a pulse shape output from the discrete time FIR filter of FIG. 6 when the digital code '100000100' is input from a spike time recorder according to an example of an embodiment.

Since the discrete time FIR filter is a linear system, when the digital code '100000100' is input from the spike time recorder, pulse shapes or waveforms corresponding to logic values '1' in the digital code are superposed. That is, a summation of a waveform A and a waveform B of FIG. 7 corresponding to the two logic values '1' in the digital code produces a waveform C of FIG. 7.

Figure 8:
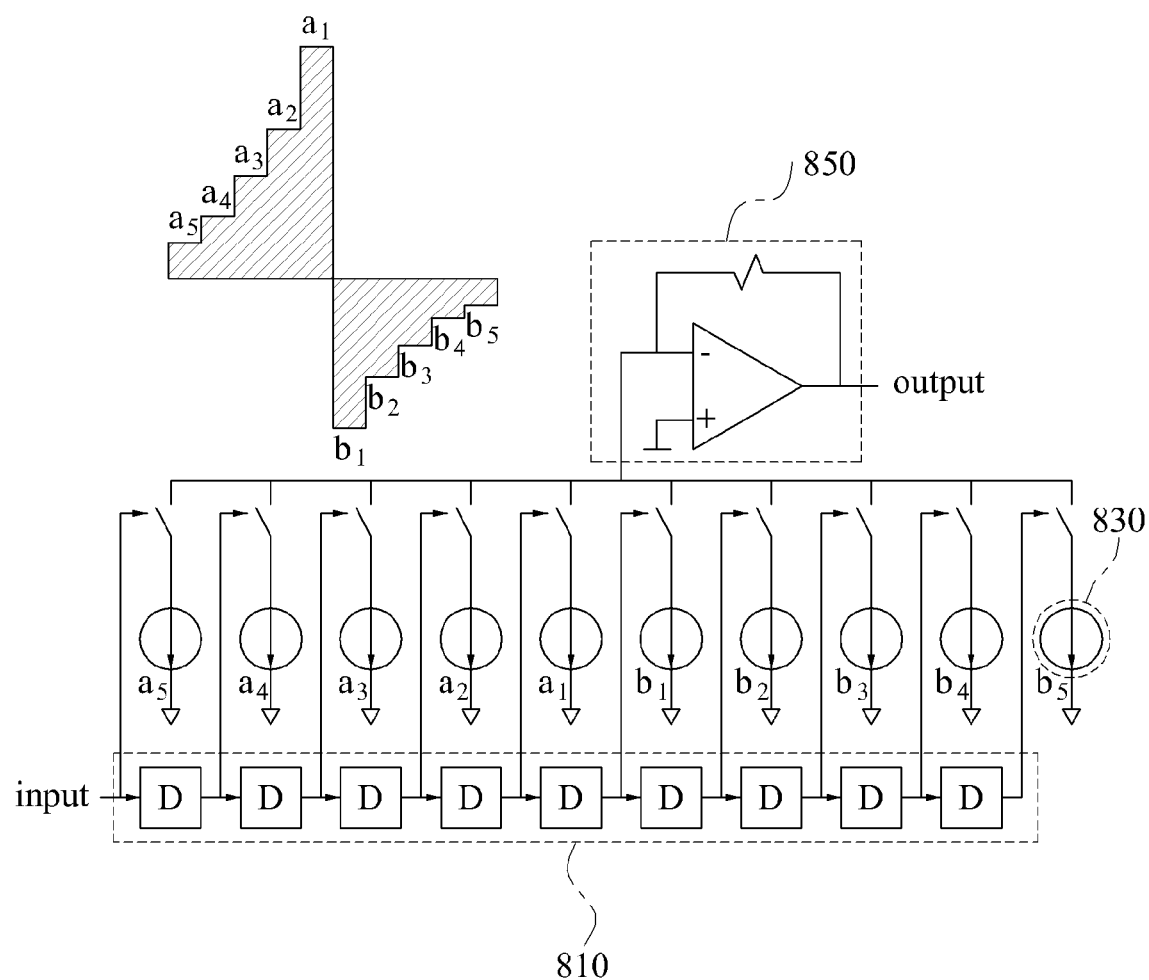
FIG. 8 is a diagram illustrating a pulse shaper designed using the discrete time FIR filter of FIG. 6.
Figure 9:
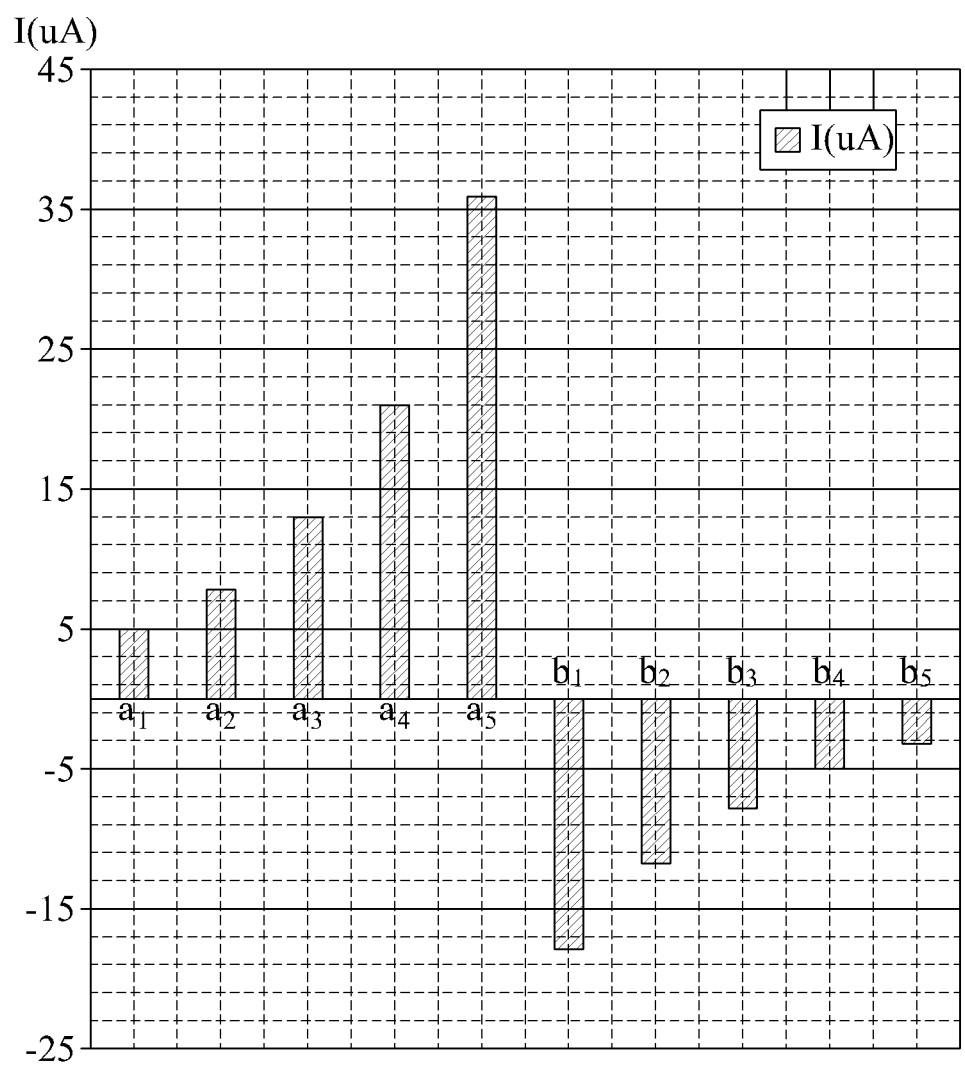
FIG. 9 is a graph illustrating current source values according to an example of an embodiment.

FIG. 8 is a diagram illustrating a pulse shaper designed using the discrete time FIR filter of FIG. 6. FIG. 9 is a graph illustrating current source values according to an example of an embodiment.

FIG. 8 illustrates a pulse shaper based on spike timing. The pulse shaper includes a discrete time FIR filter including a shift register 810, a plurality of taps 830 each including a current source, and a feedback amplifier 850. The discrete time FIR filter sequentially shifts a digital code input from a spike time recorder (not shown) using the shift register 810, and sums the shifted digital code to restore the pulse shape of the spike using the plurality of taps 830 to produce a sum of currents. The feedback amplifier 850 amplifies the sum of the currents using negative feedback.

When a logic value '1' indicating that a spike has been fired by a neuron is input to the pulse shaper in FIG. 8 from a spike time recorder, the current sources of the taps 830 are synchronized with a clock and sequentially turned on as the logic value '1' is shifted through the shift register 810. The feedback amplifier 850 outputs a voltage having the impulse response shape shown in FIG. 5 due to an IR drop of the feedback amplifier 850.

As described in the foregoing, the pulse shaper, which is a linear system, sums pulse shapes or waveforms of sequential spikes.

Current values of the current sources in FIG. 8 may be the current values indicated by a1 to a5 and b1 to b5 in FIG. 9. The current values of the current sources and a negative feedback resistance of the feedback amplifier 850 are set to implement the STDP function in consideration of resistance change characteristics of a memory device such as a memristor according to a voltage difference between voltages applied to both ends of the memory device.

That is, the current values of the current sources and the negative feedback resistance of the feedback amplifier 850 are selected to enable the STDP function cell to produce a waveform or pulse shape similar to the action potential or spike of the real neuron.

Current values a1 to a5 and b1 to b5 supplied by the current sources may have the values shown in FIG. 9 to produce a waveform or pulse shape similar to the action potential or spike of the real neuron.

Figure 10A:
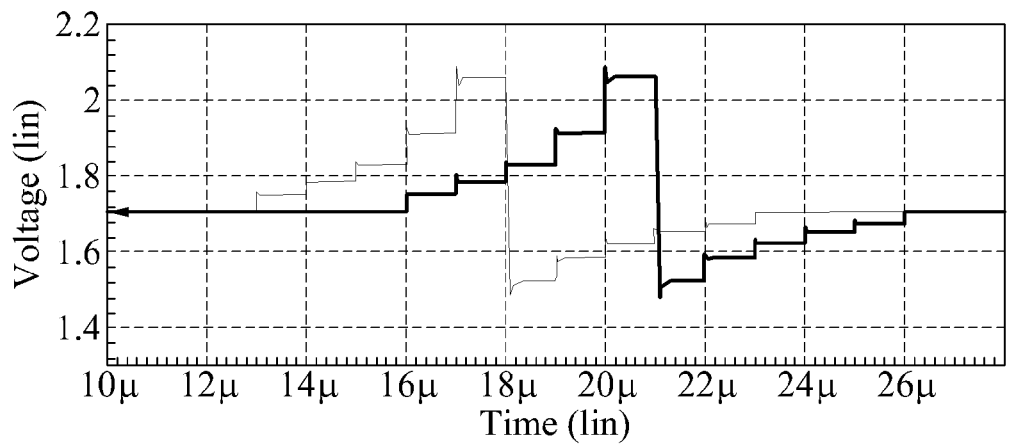
FIGS. 10A and 10B are diagrams illustrating a simulation result of the pulse shaper of FIG. 8.
Figure 10B:
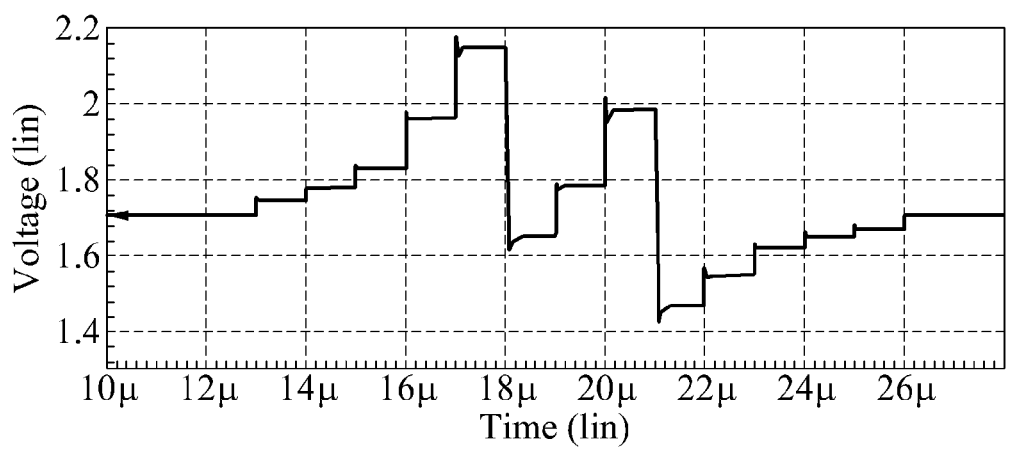

FIGS. 10A and 10B are diagrams showing a simulation result of the pulse shaper of FIG. 8.

When a digital code '1001000000000' is input to a pulse shaper, an individual waveform as shown by the dark line in FIG. 10A is generated for each logic value '1' in the digital code. Since two logic values '1' are input to the pulse shaper, two individual waveforms are generated for the two logic values '1' as shown by the dark and light lines in FIG. 10A.

The input digital code '1001000000000' after passing through the pulse shaper produces the output waveform shown in FIG. 10B, which is a summation of the two individual waveforms in FIG. 10A.

Figure 11:
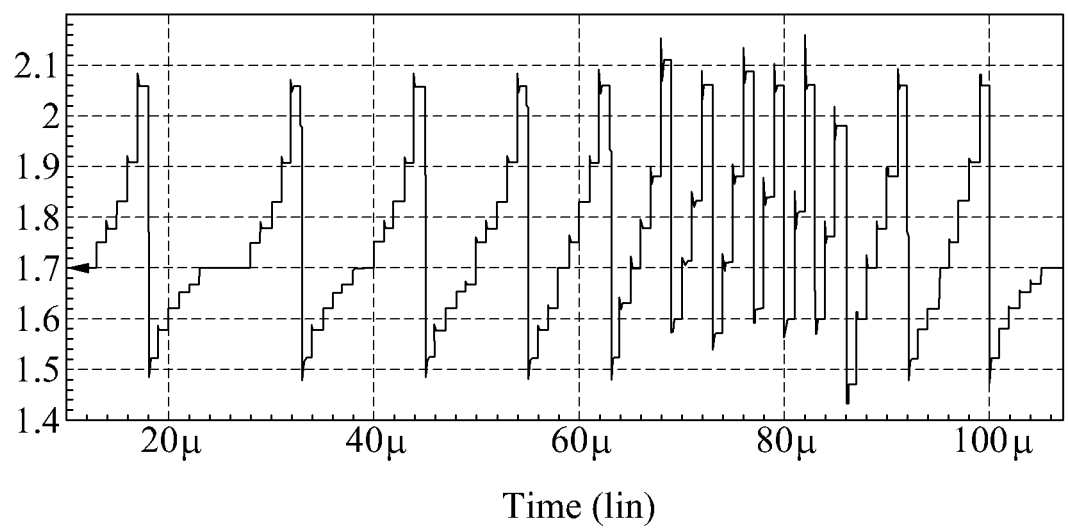
FIG. 11 is a diagram illustrating a simulation result of a pulse shaper in a case where a spike timing digital code substantially the same as in a real neuron circuit is input from a spike time recorder according to an example of an embodiment.

FIG. 11 is a diagram illustrating a simulation result of a pulse shaper in a case where a spike timing digital code substantially the same as in a real neuron circuit is input from a spike time recorder according to an example of an embodiment.

Referring to FIG. 11, the waveform in FIG. 11 is a linear summation of a plurality of the individual waveform indicated by the dark line in FIG. 10A corresponding to the logic values '1' in the spike timing digital code shown in FIG. 11 and shifted in time by the shift register 810 in FIG. 8.

Figure 12:
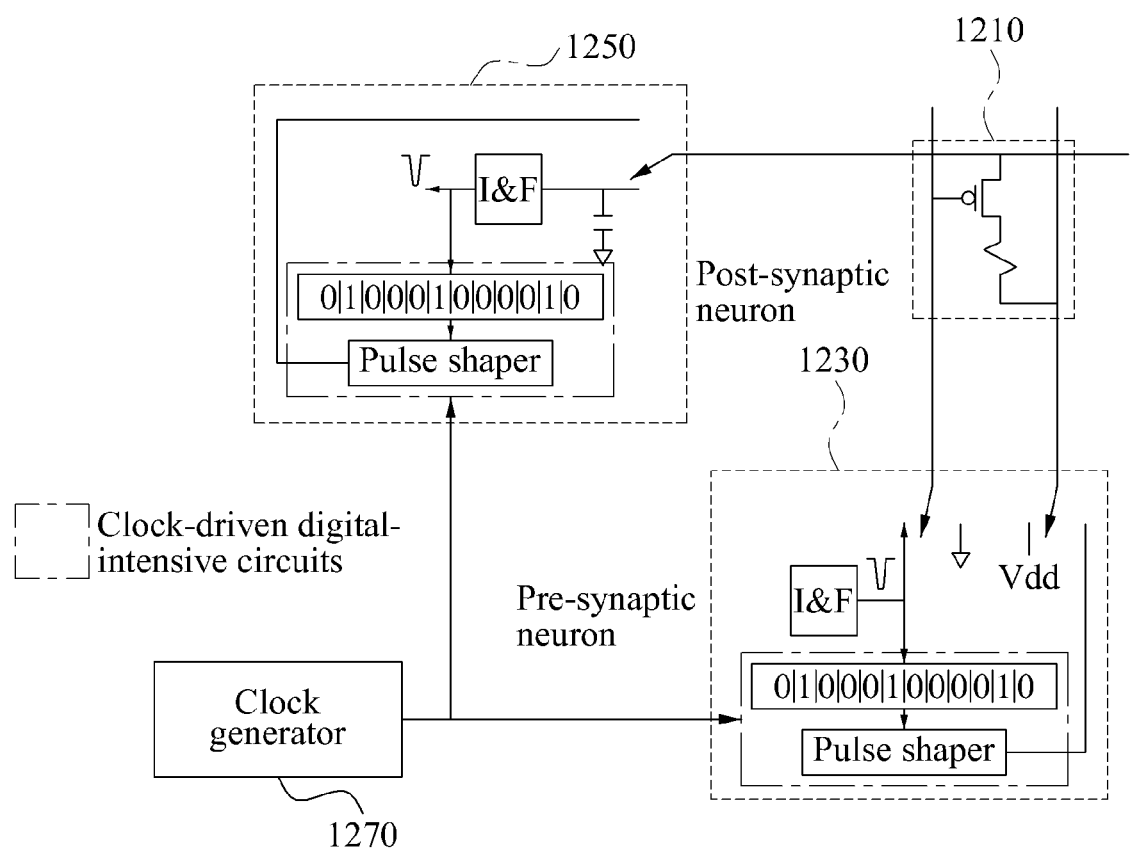
FIG. 12 is a diagram illustrating a structure of an STDP function cell operating based on a clock according to an example of an embodiment.

FIG. 12 is a diagram illustrating a structure of an STDP function cell operating based on a clock according to an example of an embodiment.

As discussed above, the STDP function cell switches between the communication mode and the learning mode.

In the communication mode, the STDP function cell operates in an asynchronous analog manner. That is, whenever a gate of a PMOS transistor of a synapse 1210 is turned on by a spike fired by an electronic neuron circuit, such as an I&F spiking neuron, of a pre-synaptic neuron 1230, a membrane capacitor of a post-synaptic neuron 1250 is charged.

In the learning mode, the STDP function cell operates so that a pulse shaper of each of the pre-synaptic neuron 1230 and the post-synaptic neuron 1250 restores a waveform of a spike from a digital code indicating a spike timing stored in a spike time recorder of each of the pre-synaptic neuron 1230 and the post-synaptic neuron 1250, that is, a point of time when an electronic neuron circuit of each of the pre-synaptic neuron 1230 and the post-synaptic neuron 1250 fires the spike. The restored waveforms are applied as voltages across both ends of a memory device of the synapse 1210, and a synaptic weight of the memory device changes according to a voltage difference between the restored waveforms. Spike time recorders and pulse shapers of the pre-synaptic neuron 1230 and the post-synaptic neuron 1250 are primarily implemented by digital circuits, and operate in synchronization with a clock generated by a clock generator 1270.

Figure 13:
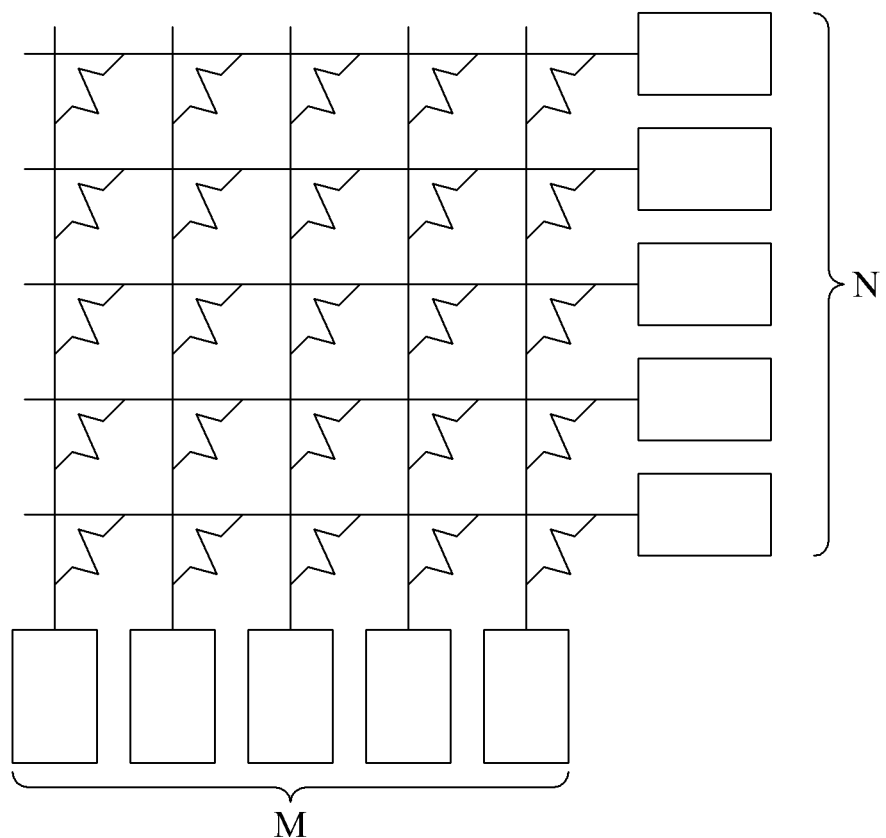
FIG. 13 is a diagram illustrating an STDP device according to an example of an embodiment.

FIG. 13 is a diagram illustrating an STDP device according to an example of an embodiment.

The STDP device has an M×N cell structure that includes a plurality of STDP function cells as shown in FIG. 13. The STDP device includes M×N synapses, M pre-synaptic neurons, and N post-synaptic neurons. M and N may be equal to each other as shown in FIG. 13, or may be different from each other. Each of the STDP function cells includes one of the synapses, and shares one of the pre-synaptic neurons and one of the post-synaptic neurons with other STDP function cells. Thus, there are M×N STDP function cells in FIG. 13, with each of the M pre-synaptic neurons being shared by N STDP function cells, and each of the N post-synaptic neurons being shared by M STDP function cells. Each of the synapses includes a memory device and a transistor connected to the memory device. The synapses are connected in a crossbar structure. The memory device includes a channel connected in series with a channel of the transistor. A resistance of the memory device varies according to a synaptic weight dependent on a voltage difference between voltages applied to both ends of the memory device.

Synapses arranged in the same row in the crossbar structure are all connected to the post-synaptic neuron in that row, and are each connected to a respective one of the pre-synaptic neurons. Also, synapses arranged in the same column in the crossbar structure are all connected to the pre-synaptic neuron in that column, and are each connected to a respective one of the post-synaptic neurons.

Each of the plurality of synapses selectively operates in a communication mode in which information is transmitted from one pre-synaptic neuron to one post-synaptic neuron, and a learning mode in which a synaptic weight of a memory device of the synapse is changed according to a voltage difference between voltages applied to both ends of the memory device. The synapses switches between the communication mode and the learning mode according to a TDM scheme.

In an STDP device according to an example of an embodiment, one synapse operates with a single path through the synapse formed by the series connection of the channel and the memory device and the channel of the transistor in both the communication mode and the learning mode.

Figure 14A:
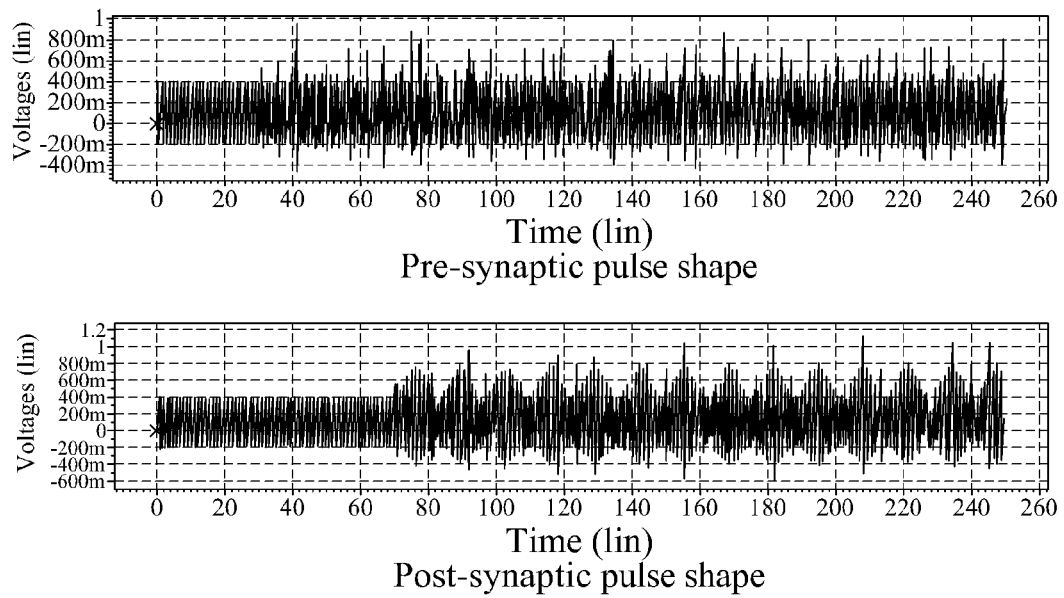
FIG. 14A is a diagram illustrating graphs showing a pulse shape applied by a pre-synaptic neuron to one end of a memristor and a pulse shape applied by a post-synaptic neuron to the other end of the memristor.
Figure 14B:
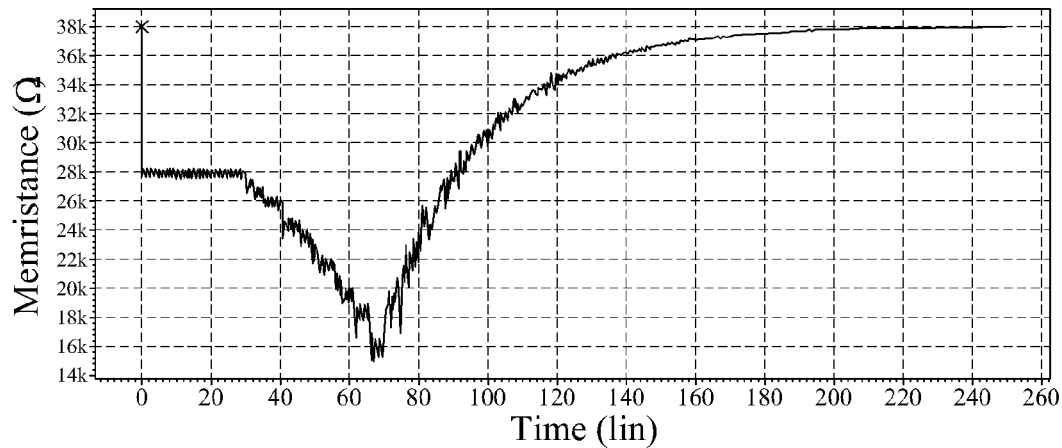
FIG. 14B is a diagram illustrating a variation of the resistance of the memristor according to the pulse shapes.

FIG. 14A is a diagram illustrating graphs showing a pulse shape applied by a pre-synaptic neuron to one end of a memristor and a pulse shape applied by a post-synaptic neuron to the other end of the memristor, and FIG. 14B is a diagram illustrating a variation of the resistance of the memristor according to the pulse shapes.

FIG. 14B illustrates memristance, that is, a variation of the resistance of the memristor when a pulse voltage of a spike output from the pre-synaptic neuron and a pulse voltage of a spike output from the post-synaptic neuron are applied to both ends of the memristor with different timings between the spikes.

In a period from 0 s to 25 s, in FIG. 14B, a pre-synaptic neuron and a post-synaptic neuron alternately fire spikes with a constant time delay between the spikes fired by the pre-synaptic neuron and the spikes fired by the post-synaptic neuron. Therefore, the memristor constantly maintains a value of about 28 kΩ.

In a period from 25 s to 65 s, the pre-synaptic neuron fires more spikes than the post-synaptic neuron. Accordingly, long term potentiation (LTP) occurs, thereby reducing the resistance of the memristor and increasing a synaptic weight of the synapse. LTP is well known to one of ordinary skill in the art, and thus will not be further described herein.

In a period after 65 s, the post-synaptic neuron fires more spikes than the pre-synaptic neuron. Accordingly, long term depression (LTD) occurs, thereby increasing the resistance of the memristor and decreasing a synaptic weight of the synapse. LTD is well known to one of ordinary skill in the art, and thus will not be further described herein.

In FIGS. 14A and 14B, the Simulation Program with Integrated Circuit Emphasis (SPICE) memristor model of disclosed in Z. Biolek, "SPICE Model of Memristor with Nonlinear Dopant Drift," *Radioengineering*, Vol. 18, No. 2, June 2009, pp. 210-214, the contents of which are incorporated herein by reference in their entirety, was used for the simulation of the variation of the resistance of the memristor. An initial resistance of the memristor was set to 28 kΩ, and 100Ω and 38 1Ω were used as $R_{ON}$ and $R_{OFF}$, respectively, of the memristor. $R_{ON}$ denotes a minimum resistance of the memristor, and $R_{OFF}$ denotes a maximum resistance of the memristor.

According to an example of an embodiment, the communication mode that transmits information through a synapse and the learning mode that changes a synaptic weight of the synapse are performed according to a TDM scheme, and are therefore performed at different times. Accordingly, a state of a particular synaptic neuron may be changed in the learning mode without influencing other synaptic neurons that are involved in communication during the communication mode.

In addition, since the impedance of the synapse when the STDP function cell is not operating in the communication mode and is not operating in the learning mode is higher than an impedance of the synapse when the STDP function cell is operating in the communication mode and is operating in the learning mode, a leakage problem occurring in a neuromorphic circuit may be solved.

Several examples of embodiments have been described above. Nevertheless, it should be understood that various modifications may be made in these examples. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the claims and their equivalents.

What is claimed is:

1. A synapse for a spike timing dependent plasticity (STDP) function cell, the synapse comprising:
   a memory device having a variable resistance; and
   a transistor connected to the memory device,
   wherein a channel of the memory device is connected in series with a channel of the transistor, and
   wherein the synapse is configured to selectively operate in a communication mode in which the synapse transmits information from a pre-synaptic neuron to a post-synaptic neuron, and a learning mode in which a synaptic weight of the synapse changes in response to a voltage difference between voltages applied to both ends of the memory device.

2. The synapse of claim 1, wherein the resistance of the memory device varies according to a synaptic weight dependent on a voltage difference between voltages applied to both ends of the memory device.

3. The synapse of claim 1, wherein the memory device is connected to a drain terminal of the transistor.

4. The synapse of claim 1, wherein the synapse is configured so that a same voltage can be applied to the memory device and a source terminal of the transistor.

5. The synapse of claim 1, further comprising:
   a first terminal connected to the memory device; and
   a second terminal connected to a source terminal of the transistor;
   wherein the synapse is connected to a pre-synaptic neuron through the first terminal, and connected to a post-synaptic neuron through the second terminal.

6. The synapse of claim 5,
   wherein the synapse is configured to switch between the communication mode and the learning mode according to a time division multiplexing (TDM) scheme.

7. The synapse of claim 6, wherein in the communication mode, the synapse transmits the information from the pre-synaptic neuron to the post-synaptic neuron by transmitting a signal generated by a spike fired by the pre-synaptic neuron to the post-synaptic neuron; and
    in the learning mode, the synaptic weight of the synapse changes as a result of the resistance of the memory device changing in response to the voltage difference between the voltages applied to both ends of the memory device.

8. The synapse of claim 6, wherein the synapse is configured to switch to the communication mode by switching the first terminal to connect to a drain voltage (VDD) of the pre-synaptic neuron, and switching the second terminal to connect to a membrane capacitor of the post-synaptic neuron.

9. The synapse of claim 6, wherein the synapse is configured to switch to the learning mode by switching the first terminal to connect to an output of a pulse shaper of the pre-synaptic neuron, and switching the second terminal to connect to an output of a pulse shaper of the post-synaptic neuron.

10. A spike timing dependent plasticity (STDP) function cell having an STDP function for a neuromorphic circuit, the STDP function cell comprising:
    a synapse comprising
        a memory device having a variable resistance,
        a transistor connected to the memory device,
        a first terminal, and
        a second terminal;
    a pre-synaptic neuron connected to the memory device through the first terminal of the synapse; and
    a post-synaptic neuron connected to a source terminal of the transistor through the second terminal of the synapse,
    wherein a channel of the memory device is connected in series with a channel of the transistor, and
    wherein the synapse is configured to selective operate in a communication mode in which the synapse transmits information from a pre-synaptic neuron to a post-synaptic neuron, and a learning mode in which a synaptic weight of the synapse changes in response to a voltage difference between voltages applied to both ends of the memory device.

11. The STDP function cell of claim 10, wherein the resistance of the memory device varies according to a synaptic weight dependent on a voltage difference between voltages applied to both ends of the memory device.

12. A spike timing dependent plasticity (STDP) function cell having an STDP function for a neuromorphic circuit, the STDP function cell comprising:
    a synapse comprising
        a memory device having a variable resistance,
        a transistor connected to the memory device,
        a first terminal, and
        a second terminal;
    a pre-synaptic neuron connected to the memory device through the first terminal of the synapse; and
    a post-synaptic neuron connected to a source terminal of the transistor through the second terminal of the synapse,
    wherein a channel of the memory device is connected in series with a channel of the transistor, wherein the pre-synaptic neuron and the post-synaptic neuron each comprise
    an electronic neuron circuit configured to fire a spike,
    a spike time recorder configured to record a point of time when the electronic neuron circuit fires the spike as a digital code, and
    a pulse shaper configured to restore a pulse shape of the spike based on the digital code,
    wherein the spike time recorder and the pulse shaper are configured to operate in synchronization with a clock.

13. The STDP function cell of claim 12, wherein the pulse shaper comprises a discrete time finite impulse response (FIR) filter configured to sequentially shift the digital code and sum the shifted digital to restore the pulse shape of the spike.

14. The STDP function cell of claim 12, wherein the STDP function cell is configured to selectively operate in a communication mode in which the synapse transmits information from the pre-synaptic neuron to the post-synaptic neuron, and a learning mode in which a synaptic weight of the synapse changes in response to a voltage difference between voltages applied to both ends of the memory device; and
    the STDP function cell is configured to switch between the communication mode and the learning mode according to a time division multiplexing (TDM) scheme.

15. The STDP function cell of claim 14, wherein the STDP function cell is configured to switch to the communication mode by switching the first terminal to connect to a drain voltage (VDD) of the pre-synaptic neuron, and switching the second terminal to connect to a membrane capacitor of the post-synaptic neuron.

16. The STDP function cell of claim 14, wherein the STDP function cell is configured to switch to the learning mode by switching the first terminal to connect to an output of the pulse shaper of the pre-synaptic neuron, and switching the second terminal to connect to an output of the pulse shaper of the post-synaptic neuron.

17. The STDP function cell of claim 14, wherein an impedance of the synapse when the STDP function cell is not operating in the communication mode and is not operating in the learning mode is higher than an impedance of the synapse when the STDP function cell is operating in the communication mode and is operating in the learning mode.

18. A neuromorphic circuit comprising a plurality of spike timing dependent plasticity (STDP) function cells, the neuromorphic circuit comprising:
    a plurality of synapses arranged in a crossbar structure, each of the synapses comprising:
        a memory device having a variable resistance; and
        a transistor connected to the memory device;
    a plurality of pre-synaptic neurons each connected to a respective column of the crossbar structure; and
    a plurality of post-synaptic neurons each connected to a respective row of the crossbar structure;
    wherein ones of the synapses arranged in a same row of the crossbar structure are all connected to the post-synaptic neuron connected to that row, and are each connected to the pre-synaptic neuron connected to a respective column of the crossbar structure;
    ones of the synapses arranged in a same column of the crossbar structure are all connected to the pre-synaptic neuron connected to that column, and are each connected to the post-synaptic neuron connected to a respective row of the crossbar structure;
    each of the STDP function cells comprises one of the synapses, one of the pre-synaptic neurons, and one of the post-synaptic neurons; and
    in each of the synapses, a channel of the memory device is connected in series with a channel of the transistor.

19. The neuromorphic circuit of claim 18, wherein the resistance of the memory device varies according to a synaptic weight dependent on a voltage difference between voltages applied to both ends of the memory device.

20. The neuromorphic circuit of claim 18, wherein each of the STDP function cells is configured to selectively operate in a communication mode in which the synapse transmits information from the pre-synaptic neuron to the post-synaptic neuron, and a learning mode in which a synaptic weight of the synapse changes in response to a voltage difference between voltages applied to both ends of the memory device; and
  each of the STDP function cells is configured to switch between the communication mode and the learning mode according to a time division multiplexing (TDM) scheme.

21. A synapse for a spike timing dependent plasticity (STDP) function cell, the synapse comprising:
  a first synapse terminal;
  a second synapse terminal;
  a synapse control terminal;
  a memory device having a variable resistance and comprising a first terminal and a second terminal; and
  a transistor comprising a first terminal, a second terminal, and a control terminal that controls a flow of current between the first terminal of the transistor and the second terminal of the transistor;
  wherein the first terminal of the memory device is connected to the first synapse terminal;
  the second terminal of the memory device is connected to the first terminal of the transistor;
  the second terminal of the transistor is connected to the second synapse terminal; and
  the control terminal of the transistor is connected to the synapse control terminal.

22. The synapse of claim 21, wherein the resistance of the memory device determines a synaptic weight of the synapse, and depends on a voltage difference between a first voltage that was last applied to the first terminal of the memory device during a last learning mode of the synapse and a second voltage that was last applied to the second terminal of the memory device during the last learning mode of the synapse.

23. The synapse of claim 21, wherein the resistance of the memory device determines a synaptic weight of the synapse, and depends on a timing between a first neuron spike that was last applied to the first terminal of the memory device during a last learning mode of the synapse and a second neuron spike that was last applied to the second terminal of the memory device during the last learning mode of the synapse.

24. The synapse of claim 21, wherein the resistance of the memory device determines a synaptic weight of the synapse, and changes in accordance with an STDP function in response to a voltage difference between a voltage of a first neuron spike applied to the first terminal of the memory device during a learning mode of the memory device and a voltage of a second neuron spike applied to the second terminal of the memory device during the learning mode of the memory device.

25. The synapse of claim 24, wherein the voltage difference depends on a difference between a time at which the first neuron spike is fired and a time at which the second neuron spike is fired.

26. The synapse of claim 25, wherein the first neuron spike is a pre-synaptic neuron spike;
  the second neuron spike is a post-synaptic neuron spike;
  the resistance of the memory device decreases if the post-synaptic neuron spike is fired after the pre-synaptic neuron spike is fired, thereby increasing the synaptic weight of the synapse; and
  the resistance of the memory device increases if the post-synaptic neuron spike is fired before the pre-synaptic neuron spike is fired, thereby decreasing the synaptic weight of the synapse.

27. The synapse of claim 21, wherein the transistor further comprises a channel connected between the first terminal of the transistor and the second terminal of the transistor; and
  the control terminal of the transistor is a gate terminal of the transistor.

28. The synapse of claim 27, wherein the first terminal of the transistor is a drain terminal of the transistor; and
  the second terminal of the transistor is a source terminal of the transistor.

29. The synapse of claim 21, wherein a current cannot flow between the first terminal of the synapse and the second terminal of the synapse when the control terminal of the transistor turns the transistor off so that current cannot flow between the first terminal of the transistor and the second terminal of the transistor.

30. A spike timing dependent plasticity (STDP) function cell comprising:
  a synapse comprising a first synapse terminal, a second synapse terminal, and a synapse control terminal;
  a pre-synaptic neuron connected to the first synapse terminal; and
  a post-synaptic neuron connected to the second synapse terminal;
  wherein the synapse further comprises:
    a memory device having a variable resistance and comprising a first terminal and a second terminal; and
    a transistor comprising a first terminal, a second terminal, and a control terminal that controls a flow of current between the first terminal of the transistor and the second terminal of the transistor;
  the first terminal of the memory device is connected to the first synapse terminal;
  the second terminal of the memory device is connected to the first terminal of the transistor;
  the second terminal of the transistor is connected to the second synapse terminal; and
  the control terminal of the transistor is connected to the synapse control terminal.

31. The STDP function cell of claim 30, wherein the pre-synaptic neuron and the post-synaptic neuron each comprise:
  an electronic neuron circuit configured to fire a neuron spike;
  a spike time recorder configured to receive the neuron spike from the electronic neuron circuit and record a firing time point of the neuron spike as a digital code; and
  a pulse shaper configured to receive the digital code from the spike time recorder and output a voltage pulse having a shape of the neuron spike in response to the digital code;
  the pre-synaptic neuron further comprises:
  a first voltage supply terminal; and
  a second voltage supply terminal;
  the post-synaptic neuron further comprises a capacitor;
  in a communication mode of the STDP function cell, the first synapse terminal is connected to the first voltage supply terminal of the pre-synaptic neuron, the second synapse terminal is connected to the capacitor of the post-synaptic neuron, and the synapse control terminal receives the neuron spike fired by the electronic neuron circuit of the pre-synaptic neuron; and in a learning mode of the STDP function cell, the first synapse terminal receives the voltage pulse output by the pulse shaper of the pre-synaptic neuron, the second synapse terminal receives the voltage pulse output by the pulse shaper of the post-synaptic neuron, and the synapse control terminal is connected to the second voltage supply terminal of the pre-synaptic neuron.

* * * * *